(12) United States Patent
Delisle

(10) Patent No.: US 11,508,256 B2
(45) Date of Patent: Nov. 22, 2022

(54) PERSPECTIVE SELECTION FOR A DEBRIEFING SCENE

(71) Applicant: CAE Inc., Saint-Laurent (CA)

(72) Inventor: Jean-François Delisle, Montréal (CA)

(73) Assignee: CAE Inc., Saint-Laurent (CA)

( * ) Notice: Subject to any disclaimer, the term of this patent is extended or adjusted under 35 U.S.C. 154(b) by 660 days.

(21) Appl. No.: 15/476,952

(22) Filed: Mar. 31, 2017

(65) Prior Publication Data

US 2018/0232133 A1    Aug. 16, 2018

Related U.S. Application Data

(63) Continuation of application No. 15/432,988, filed on Feb. 15, 2017.

(51) Int. Cl.

| | |
|---|---|
| *G06F 3/0484* | (2022.01) |
| *G06F 3/0482* | (2013.01) |
| *G06T 11/60* | (2006.01) |
| *G09B 9/20* | (2006.01) |
| *G09B 9/30* | (2006.01) |
| *G06F 3/01* | (2006.01) |
| *G06F 30/20* | (2020.01) |
| *G06F 3/0481* | (2022.01) |
| *G09B 9/10* | (2006.01) |

(Continued)

(52) U.S. Cl.
CPC ............ *G09B 9/301* (2013.01); *G06F 3/01* (2013.01); *G06F 3/011* (2013.01); *G06F 3/0481* (2013.01); *G06F 30/20* (2020.01); *G06T 11/60* (2013.01); *G09B 9/10* (2013.01); *G09B 9/12* (2013.01); *G09B 9/20* (2013.01);

*G09B 9/24* (2013.01); *G09B 9/302* (2013.01); *G06F 30/15* (2020.01); *G09B 9/08* (2013.01)

(58) Field of Classification Search
CPC ........ G06F 19/00; G06F 19/04; G06F 19/418; G06F 19/18; G06F 15/00; G06F 3/01; G06F 3/011; G06F 3/0481; G06F 30/20; G06F 30/15; G09B 9/301; G09B 9/10; G09B 9/12; G09B 9/20; G09B 9/24; G09B 9/302; G09B 9/08; G06T 11/60
See application file for complete search history.

(56) References Cited

U.S. PATENT DOCUMENTS

| | | |
|---|---|---|
| 4,952,152 A | 8/1990 | Briggs et al. |
| 5,584,696 A | 12/1996 | Walker et al. |

(Continued)

*Primary Examiner* — Jennifer N Welch
*Assistant Examiner* — Parmanand D Patel
(74) *Attorney, Agent, or Firm* — Matthew Roy; Gowling WLG (Canada) LLP

(57) ABSTRACT

Debriefing a session from a user in a system. During the session, while the user performs actions on one or more tangible instruments of the system, dynamic data is logged in relation to the system along a session timeline. The dynamic data covers the actions of the user on tangible instrument(s). A graphical user interface depicting a debriefing scene, related to the session, is displayed from a first point of view starting at a first time within the session timeline. The debriefing scene is generated starting at the first time from at least a first image feed. Upon detection of a predetermined event in the dynamic data at a second time along the session timeline, a second point of view different from the first point of view is defined and the debriefing scene is generated therefrom after the second time using at least a second image feed.

11 Claims, 3 Drawing Sheets

(51) Int. Cl.
*G09B 9/12* (2006.01)
*G09B 9/24* (2006.01)
*G06F 30/15* (2020.01)
*G09B 9/08* (2006.01)

(56) References Cited

U.S. PATENT DOCUMENTS

| | | | |
|---|---|---|---|
| 6,370,457 B1* | 4/2002 | Nemeth | G09B 9/003 |
| | | | 434/35 |
| 8,135,481 B2 | 3/2012 | Blevins et al. | |
| 8,751,203 B2 | 6/2014 | Falash et al. | |
| 8,788,138 B1 | 7/2014 | Yogesha et al. | |
| 9,449,176 B1 | 9/2016 | Adams | |
| 2006/0132482 A1* | 6/2006 | Oh | G06T 13/80 |
| | | | 345/419 |
| 2006/0152533 A1 | 7/2006 | Read | |
| 2006/0247070 A1* | 11/2006 | Funk | A63B 69/3623 |
| | | | 473/222 |
| 2007/0236366 A1* | 10/2007 | Gur | G06K 9/00 |
| | | | 340/945 |
| 2008/0040084 A1 | 2/2008 | Huang | |
| 2008/0155443 A1 | 6/2008 | Pannese et al. | |
| 2010/0266992 A1 | 10/2010 | Gregoire et al. | |
| 2010/0266994 A1 | 10/2010 | Gregoire et al. | |
| 2012/0259508 A1* | 10/2012 | O'Connor | G01C 23/00 |
| | | | 701/33.4 |
| 2013/0084765 A1 | 4/2013 | Pak | |
| 2013/0261876 A1* | 10/2013 | Froom | G01M 5/0016 |
| | | | 701/29.3 |
| 2014/0135986 A1 | 5/2014 | Kanehara et al. | |
| 2014/0310633 A1 | 10/2014 | McLellan et al. | |
| 2015/0050623 A1 | 2/2015 | Falash et al. | |
| 2015/0127316 A1* | 5/2015 | Avisar | G06T 13/20 |
| | | | 703/11 |
| 2015/0145704 A1* | 5/2015 | Dahan | G09B 9/30 |
| | | | 340/971 |
| 2015/0217874 A1 | 8/2015 | Mesguen et al. | |
| 2015/0261379 A1 | 9/2015 | Kneuper et al. | |
| 2016/0037139 A1* | 2/2016 | Bacus | F21V 21/03 |
| | | | 348/157 |
| 2016/0357892 A1 | 12/2016 | Schechter et al. | |
| 2016/0381290 A1* | 12/2016 | Prayle | H04N 5/23203 |
| | | | 348/207.11 |
| 2017/0092223 A1 | 3/2017 | Fain et al. | |
| 2017/0273745 A1 | 9/2017 | Turquier et al. | |
| 2018/0060456 A1 | 3/2018 | Phatak et al. | |

* cited by examiner

PERSPECTIVE SELECTION FOR A DEBRIEFING SCENE

PRIORITY STATEMENT

This non-provisional patent application claims priority based upon the prior U.S. patent application entitled "VISUALIZING SUB-SYSTEMS OF A VIRTUAL SIMULATED ELEMENT IN AN INTERACTIVE COMPUTER SIMULATION SYSTEM", application Ser. No. 15/432,988, filed Feb. 15, 2017, in the name of CAE Inc., which is incorporated herein in its entirety.

This non-provisional patent application claims priority based upon the prior PCT patent application entitled "VISUALIZING SUB-SYSTEMS OF A VIRTUAL SIMULATED ELEMENT IN AN INTERACTIVE COMPUTER SIMULATION SYSTEM", application number PCT/CA2017/050181, filed Feb. 15, 2017, in the name of CAE Inc., which is incorporated herein in its entirety.

TECHNICAL FIELD

The present invention relates to an interactive computer simulation system and, more particularly, to management of a training session in the interactive computer simulation system.

BACKGROUND

Interactive computer simulation systems are used to train personnel on complex and/or risky tasks. The interactive computer simulation allows a user to interact in a computer generated environment by controlling a simulated element (e.g., an aircraft, a ground vehicle, a space station, etc.). Simulated elements comprise various dynamic sub-systems that act, e.g., in relation to the actions of the user in the interactive computer simulation. The user is ask to selectively focus on one or more of the dynamic subsystems, depending on the context of the simulation. It is currently difficult to provide feedback on how the user manages focus throughout the simulation.

The present invention at least partly addresses this shortcoming.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first set of embodiments, a first aspect is directed to a method for debriefing a session from a user in a system. The method comprises, during the session, while the user performs actions on one or more tangible instruments of the system, logging dynamic data in relation to the system along a session timeline, the dynamic data covering the actions of the user on the one or more tangible instruments. The method also comprises displaying a graphical user interface depicting a debriefing scene, related to the session, from a first point of view starting at a first time within the session timeline, the debriefing scene being generated starting at the first time from at least a first image feed. Upon detection of a predetermined event in the dynamic data at a second time along the session timeline, the method continues with defining a second point of view different from the first point of view, the debriefing scene being generated after the second time from at least a second image feed.

The method may further comprise generating the first image feed and the second image feed from at least one of rendered images of the computer generated environment and one or more image feed recordings made during the session. The method may also comprise, alternatively or in addition, recording at least one multi-perspective image-feed, supporting a plurality of perspective selections, during the session along the session timeline. The method may then also comprise generating the first image feed and the second image feed from the multi-perspective image-feed from different ones of plurality of perspective selections.

In some embodiments, the method further comprises receiving the predetermined event and receiving a selection of the second point of view from a monitoring or debriefing station.

The system may be an interactive computer simulation station and the one or more tangible instruments may then allow the user to control a virtual simulated element in a computer generated environment of an interactive computer simulation system. The interactive computer simulation station may be a flight simulator training station related to a simulated aircraft and the one or more tangible instruments may comprise elements of a replicated aircraft cockpit and the virtual simulated element is a simulated aircraft.

In some embodiments, the system is an actual aircraft and the one or more tangible instruments comprise elements of an aircraft cockpit.

The method may further comprise, prior to displaying and after completion of the session, loading the dynamic data at a debriefing station.

Detection of the predetermined event in the dynamic data may be performed after completion of the session in real-time priority processing at the debriefing station.

The method may further comprise, prior to displaying, in non-real-time priority processing and after completion of the session and, associating each of a plurality of predetermined events in the dynamic data with one or more of the image feeds along the session timeline, the plurality of predetermined events comprising the predetermined event. Detection of the predetermined event in the dynamic data may then be performed at a debriefing station by matching the predetermined event with the second point of view.

Defining the second point of view may optionally be performed by matching the predetermined event with one of a plurality of preset configurations.

After defining the second point of view, a transition debriefing scene may be generated from the first point of view towards the second point of view. The transition debriefing scene may comprise rendered images from a virtual representation of the system. The transition debriefing scene may additionally or alternatively be set to a duration during which the session timeline continues.

The method may further comprise loading a session plan for the session and the predetermined event is detected from the session plan.

The method may further comprise, while a second session is being held in the system, logging a second set of dynamic data in relation to the system along a second session timeline, the second set of dynamic data covering a second set of actions on the one or more tangible instruments, recording a second plurality of image feeds related to the session along the second session timeline and identifying trends between the actions performed during the session and the second set of actions performed during the second session by detecting one or more matching events in the dynamic data and the second set of dynamic data, the predetermined event corresponding to one of the matching events.

In accordance with the first set of embodiments, a second aspect is directed to a debriefing system for debriefing a session from a user in a system. The debriefing system comprises a tracking module that, during the session while the user performs actions on one or more tangible instruments of the system, logs dynamic data in relation to the system along a session timeline, the dynamic data covering the actions of the user on the one or more tangible instruments and records a plurality of image feeds related to the session along the session timeline. The debriefing system also comprises a debriefing station comprising a display module for displaying, after completion of the session, a graphical user interface depicting a debriefing scene, related to the session, from a first point of view starting at a first time within the session timeline, the debriefing scene being generated starting at the first time from at least a first one of the image feeds and a processing module that, upon detection of a predetermined event in the dynamic data at a second time along the session timeline, defines a second point of view, wherein the display module of the debriefing station generates the debriefing scene after the second time from at least a second one of the image feeds.

The system may be a flight simulator training station and the one or more tangible instruments may comprise elements of a replicated aircraft cockpit, the virtual simulated element being a simulated aircraft.

In accordance with a second set of embodiments, a third aspect is directed to a method for monitoring a training session from a trainee in an interactive computer simulation system. The method comprises, during the training session, while the trainee performs actions in an interactive computer simulation station on one or more tangible instruments thereof for controlling a virtual simulated element, logging dynamic data related to the actions of the trainee. The method also comprises, at a monitoring station of the interactive computer simulation system and during the training session, displaying a graphical user interface depicting a contextual scene related to the interactive computer simulation from a first point of view and detecting a predetermined event in the dynamic data during the training session. At the monitoring station, the method continues with defining a second point of view different from the first point of view, the contextual scene being generated in the graphical user interface after the predetermined event detection from the second point of view.

Optionally, the method may further comprise receiving the predetermined event from the monitoring station and receiving a selection of the second point of view from the monitoring station.

The interactive computer simulation station may be a flight simulator training station related to a simulated aircraft and the one or more tangible instruments may comprise elements of a replicated aircraft cockpit and the virtual simulated element is a simulated aircraft.

Optionally, the method may further comprise generating the contextual scene from one or more image feeds recorded in the interactive computer simulation station during the training session and from one or more image feeds rendered from the computer generated environment.

In some embodiments, the method further comprises, in non-real-time priority processing and after completion of the session, associating each of a plurality of predetermined events in the dynamic data with one or more of the image feeds along the session timeline, the plurality of predetermined events comprising the predetermined event for subsequent debriefing of the session.

Defining the second point of view may optionally be performed by matching the predetermined event with one of a plurality of preset configurations for the graphical user interface.

Defining the second point of view may optionally comprise selecting the second point of view upon identification of the predetermined event as being associated therewith. The method may then further comprise setting the association between the second point of view and the predetermined event is performed by statistically computing a plurality of past point of view selection decisions made from the monitoring station for at least one of the predetermined event and the training session. Statistically computing selection decisions is performed considering identity of at least one of a decision maker at the monitoring station and identify of the trainee.

Detection of the predetermined event in the dynamic data may optionally be performed in real-time priority processing at the monitoring station.

Defining the second point of view may further involve generating a transition contextual scene the first point of view towards the second point of view.

The method may further comprise loading a session plan for the training session, wherein the predetermined event is detected from the session plan.

In some embodiments, the method may further comprise, while a second training session is being held in the interactive computer simulation system, logging a second set of dynamic data in relation to the virtual simulated element covering a second set of actions on the one or more tangible instruments and identifying trends between the actions performed during the training session and a second set of actions performed during the second training session by detecting one or more matching events in the dynamic data and the second set of dynamic data, the predetermined event corresponding to one of the matching events.

In accordance with the second set of embodiments, a fourth aspect is directed to a monitoring station for monitoring a training session from a trainee in an interactive computer simulation system. The monitoring station comprises a tracking module, a display module and a processing module.

The tracking module, during the training session and while the trainee performs actions in an interactive computer simulation station on one or more tangible instruments thereof for controlling a virtual simulated element, logs dynamic data related to the actions of the trainee.

The display module, during the training session, displays a graphical user interface depicting a contextual scene related to the interactive computer simulation from a first point of view.

The processing module detects a predetermined event in the dynamic data during the training session and defines a second point of view different from the first point of view. The display module generates the contextual scene in the graphical user interface after the predetermined event detection from the second point of view.

Optionally, the interactive computer simulation station may be a flight simulator training station related to a simulated aircraft and the one or more tangible instruments comprise elements of a replicated aircraft cockpit and the virtual simulated element is a simulated aircraft.

In accordance with the second set of embodiments, a fifth aspect is directed to an interactive computer simulation system comprising an interactive computer simulation station, a tracking module, a monitoring station and a processing module. The interactive computer simulation station hosts a trainee that performs actions on one or more tangible instruments thereof for controlling a virtual simulated element in a computer generated environment. The tracking module, during the training session, logs dynamic data related to the actions of the trainee. The monitoring station comprises a display module that displays a graphical user interface depicting a contextual scene related to the interactive computer simulation from a first point of view. The processing module detects a predetermined event in the dynamic data during the training session and defines a second point of view different from the first point of view. The display module generates the contextual scene in the graphical user interface after the predetermined event detection from the second point of view.

The interactive computer simulation station may be a flight simulator training station related to a simulated aircraft and the one or more tangible instruments may comprise elements of a replicated aircraft cockpit and the virtual simulated element is a simulated aircraft.

The display module may further generate the contextual scene from one or more image feeds recorded in the interactive computer simulation station during the training session. The contextual scene may be generated by rendering images from the computer generated environment in addition to the one or more image feeds.

The tracking module may, in non-real-time priority processing and after completion of the session, associate each of a plurality of predetermined events in the dynamic data with one or more image feeds.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
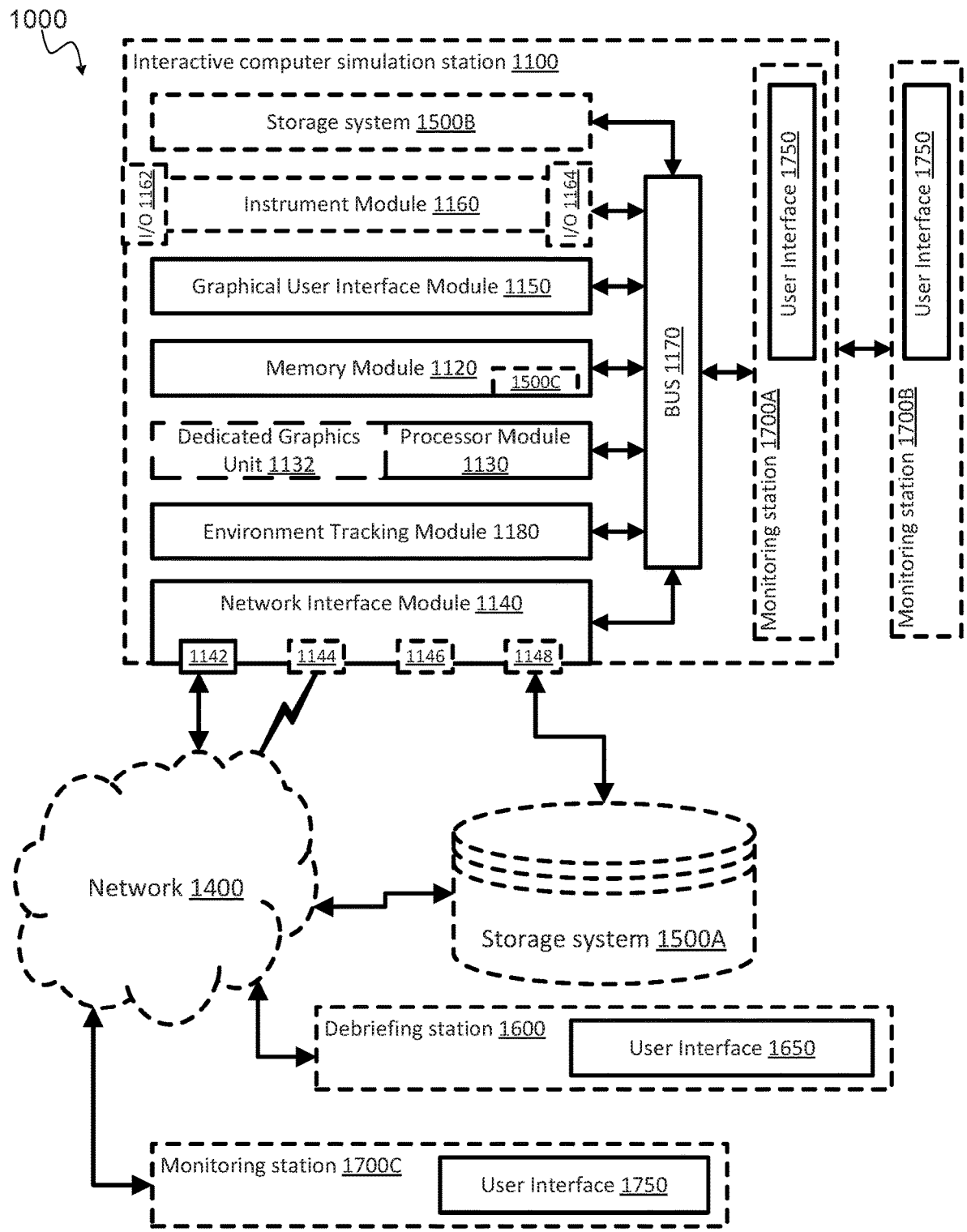
FIG. 1 is a logical modular view of an exemplary interactive computer simulation system in accordance with an embodiment of the present invention.

Reference is now made to the drawings in which FIG. 1 shows a logical modular view of an exemplary interactive computer simulation system 1000 in accordance with the teachings of the present invention. The interactive computer simulation system 1000 performs one or more interactive computer simulations. Each interactive computer simulation comprises one or more virtual simulated elements each representing an actual system (e.g., multiple virtual aircraft systems each representing an actual aircraft). Each interactive computer simulation provides a virtual environment and various tangible instruments (or controls) to allow enactment of different scenarios for the purpose of training one or more users (or trainees), using one or more of the virtual simulated elements, in the operation and/or understanding of the corresponding one or more actual systems. The virtual simulated element, or simulated element, is defined herein as a simulated system comprising multiple simulated dynamic sub-systems, or dynamic sub-systems. The simulated element is a virtual version that simulates, to the extent required by the interactive computer simulation, behavior of an actual system. Correspondingly, each of the simulated dynamic sub-systems of the simulated element is a virtual version, to the extent required but the interactive computer simulation, behavior of actual sub-systems of the actual system.

In the depicted embodiment of FIG. 1, the interactive computer simulation system 1000 comprises an interactive computer simulation station 1100 for controlling at least one of the virtual simulated elements from the computer simulation executed on the interactive computer simulation system 1000. The interactive computer simulation system 1000 typically comprises multiple simulation stations (not shown) that each allow one or more users to interact to control a virtual simulated element in one of the interactive computer simulation(s) of the interactive computer simulation system 1000. The interactive computer simulation system 1000 also comprises a debriefing station 1600 and a monitoring station 1700 also sometimes referred to as an Instructor Operating Station (IOS). The monitoring stations may be provided for allowing various management tasks (not shown) to be performed in the interactive computer simulation system 1000. The tasks associated with the monitoring station 1700 allow for control and/or monitoring of one or more ongoing interactive computer simulations. For instance, the monitoring station 1700 may be used for allowing an instructor to participate to the interactive computer simulation and possibly additional interactive computer simulation(s). In some embodiments, the monitoring station 1700 is provided with the interactive computer simulation station 1100 (1700A). In other embodiments, the monitoring station 1700 may be co-located with the interactive computer simulation station 1100 (1700C), e.g., within the same room or simulation enclosure or remote therefrom (1700C), e.g., in different rooms or in different locations connected through a network 1400. Skilled persons will understand the many instances of the monitoring station 1700 may be concurrently provided in the interactive computer simulation system 1000. The monitoring station 1700 may provide a computer simulation management interface, which may be displayed on a dedicated monitoring station 1700 user interface 1750 or the GUI module 1150. The monitoring station 1700, in some embodiments, is provided as the GUI 1750 on a portable computing device (e.g., smartphone, tablet, portable computer or the like).

When multiple simulation stations 1100 are present in the system 1000, the monitoring station 1700 may present different views of the computer program management interface (e.g., to manage different aspects therewith) or they may all present the same view thereof. The computer program management interface may be permanently shown on a first of the screens of the monitoring station 1700 display module while a second of the screen of the monitoring station 1700 display module shows a view of the interactive computer simulation (i.e., adapted view considering characteristics of the second screen). The computer program management interface may also be triggered on the monitoring station 1700, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation station 1100. A virtualized monitoring station may also be provided to the user (e.g., through the GUI module 1150) on a main screen, on a secondary screen or a dedicated screen.

In some embodiments, the interactive computer simulation system 1000 comprising a debriefing station 1600. The debriefing station 1600 is sometimes referred to as a Brief and Debrief System (BDS). The debriefing station 1600 may provide functionalities also provided by the monitoring station 1700 in the context of debriefing past sessions thereat. For instance, when monitoring station 1700 and/or debriefing station 1600 functionalities are provided through the computer system 1100, the GUI module 1150/1650/1650 may further be used to monitor and control one or more ongoing or recorded interactive computer simulation (e.g., triggering/monitoring events and/or selecting a perspective from which to view the ongoing or recorded chain of events of one or more interactive computer simulation).

The simulation station 1100, the monitoring station 1700 and the debriefing station 1600 may be connected via a network 1400, via direct connections or a mix of direct and network connections. In the depicted example of FIG. 1, the simulation station 1100 is a distinct simulation station while, in some embodiments, the simulation station 1100 may be integrated with one or more of the simulation stations. Various network links may be implicitly or explicitly used in the context of the present invention. While a link may be depicted as a wireless link, it could also be embodied as a wired link using a coaxial cable, an optical fiber, a category 5 cable, and the like. A wired or wireless access point (not shown) may be present on links. Likewise, any number of routers and/or switches (not shown) may be present on links, which may further transit through the Internet.

In the depicted example of FIG. 1, the simulation station 1100 comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated graphics processing unit 1132. The dedicated graphics processing unit 1132 may be required, for instance, when the interactive computer simulation system 1000 performs an immersive simulation (e.g., pilot training-certified flight simulator), which requires extensive image generation capabilities (i.e., quality and throughput) to maintain expected realism of such immersive simulation. Typically, each of the monitoring station 1700 and/or debriefing station 1600 comprise a memory module similar to 1120, a processor module similar to 1130 having a dedicated graphics processing unit similar to 1132, a network interface similar to 1140 and a bus similar to 1170, which have not been replicated on FIG. 1 for the sake of readability. In some embodiments, the monitoring station 1700 and/or debriefing station 1600 may also comprise an instrument module similar to 1160 and an environment tracking module similar to 1180.

The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the simulation station 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the simulation station 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the simulation station 1100 to perform routine as well as innovative steps related to the present invention.

The interactive computer simulation station 1100 exemplified on FIG. 1 also comprises an environment tracking module 1180, which may be used to capture one or more feed of images and/or environmental data from the interactive computer simulation station 1100. For instance, the environment tracking module 1180 may comprise one or more 360-degree camera and/or a plurality of cameras throughout the simulation station 1100 to provide a choice of perspectives in the simulation station 1100. For instance, the perspectives offered through the cameras may be set to cover as many critical locations in the simulation station 1100 (e.g., position of the hands of trainee(s), readings or settings on one or more of the instruments and/or determination of a position of one or more instruments, tracking of the trainee(s)' gaze or other body parts, etc. The environment tracking module 1180 may also comprise one or more sound recorders (e.g., for conversations in the simulation station as well as with outside elements), one or more thermometer, one or more biometric readers (e.g., trainee(s)' status readings, gaze detector, sleepiness detector, etc.), smoke or other visual impairment detector, etc. The environment tracking module 1180 may also gather and/or send one or more of the tracked stream of information from other elements of the system 1000 (e.g., video recorder system, simulation engine, simulation station's security system, etc.)

The interactive computer simulation system 1000 comprises a storage system 1500 for logging dynamic data in relation to the dynamic sub-systems while the interactive computer simulation is performed. FIG. 1 shows examples of the storage system 1500 as a distinct database system 1500A, a distinct module 1500B of the computer system 1110 or a sub-module 1500C of the memory module 1120 of the simulation station 1100. The storage system 1500 may also comprise storage modules (not shown) on the monitoring station 1700 and/or debriefing station 1600. The storage system 1500 may be distributed over different systems A, B, C and/or the monitoring station 1700 and/or debriefing station 1600 or may be in a single system. The storage system 1500 may comprise one or more logical or physical as well as local or remote hard disk drive (HDD) (or an array thereof). The storage system 1500 may further comprise a local or remote database made accessible to the simulation station 1100 by a standardized or proprietary interface or via the network interface module 1140. The variants of storage system 1500 usable in the context of the present invention will be readily apparent to persons skilled in the art.

The simulation station 1100 comprises a graphical user interface (GUI) module 1150 that ultimately allows the visualization of virtual dynamic sub-systems from the virtual simulated element. The GUI module 1150 may comprise one or more display screens such as a wired or wireless flat screen, a wired or wireless touch-sensitive display, a tablet computer, a portable computer or a smart phone.

Users of the interactive computer simulation system 1000 (e.g., users of the simulation stations 1100) interact in the interactive computer simulation to control a virtual simulated element in a computer generated environment of the interactive computer simulation system 1000 (e.g., instructors or experts, trainees such as a pilot and co-pilot, a driver, an operator, a surgeon, a flight investigator, a training analyst, a flight analyst, etc.). Examples of virtual simulated elements include a simulated aircraft system, a simulated ground vehicle system, a simulated spacecraft or space station system, a simulated control room system, unmanned vehicle or drone, simulated human mannequin, etc. Examples of virtual dynamic sub-systems vary depending on the virtual simulated element. In the example of a simulated aircraft system, typical virtual dynamic sub-systems may include virtual hydraulic systems, virtual communication systems, virtual display systems, virtual wiring systems, virtual in-flight entertainment systems, virtual fuel systems, virtual lighting systems, virtual rudder system, virtual flap system, virtual landing gear system, etc. In the example of a simulated living system, typical virtual dynamic sub-systems may include blood system, digestive system immunity response system, lymphatic system, nervous system, biometric data such as temperature, blood pressure and other related physical data, etc. When a trainee or user is involved, actual measurements of biometric data may also be recorded (e.g., for subsequent correlation with other recorded data). For instance, biometric data from a pilot interacting in a computer simulation with one or more tangible instruments at the simulation station 1100 may be recorded (such as temperature, blood pressure and other related physical data). As a skilled person would appreciate, most virtual sub-systems are directly or indirectly affected by interactions of the user with one or more tangible instruments that allow the user to interact (e.g., provide different commands in order to control the virtual simulated element) during the interactive computer system in the computer generated environment. Some other virtual sub-systems may be affected by time elapsed during the interactive computer system and may further take into account the interactions of the user with one or more tangible instruments. For instance, in the example of a simulated aircraft system, a virtual aircraft structure subsystem may comprise one or more virtual mechanical components. Failure of any one of virtual mechanical components, or the virtual aircraft structure subsystem altogether, may be based on accumulated mechanical stress considering use time (e.g., number of flights and operating hours) and also based on maneuvers caused by the pilot manipulating the one or more tangible instruments.

Figure 2:
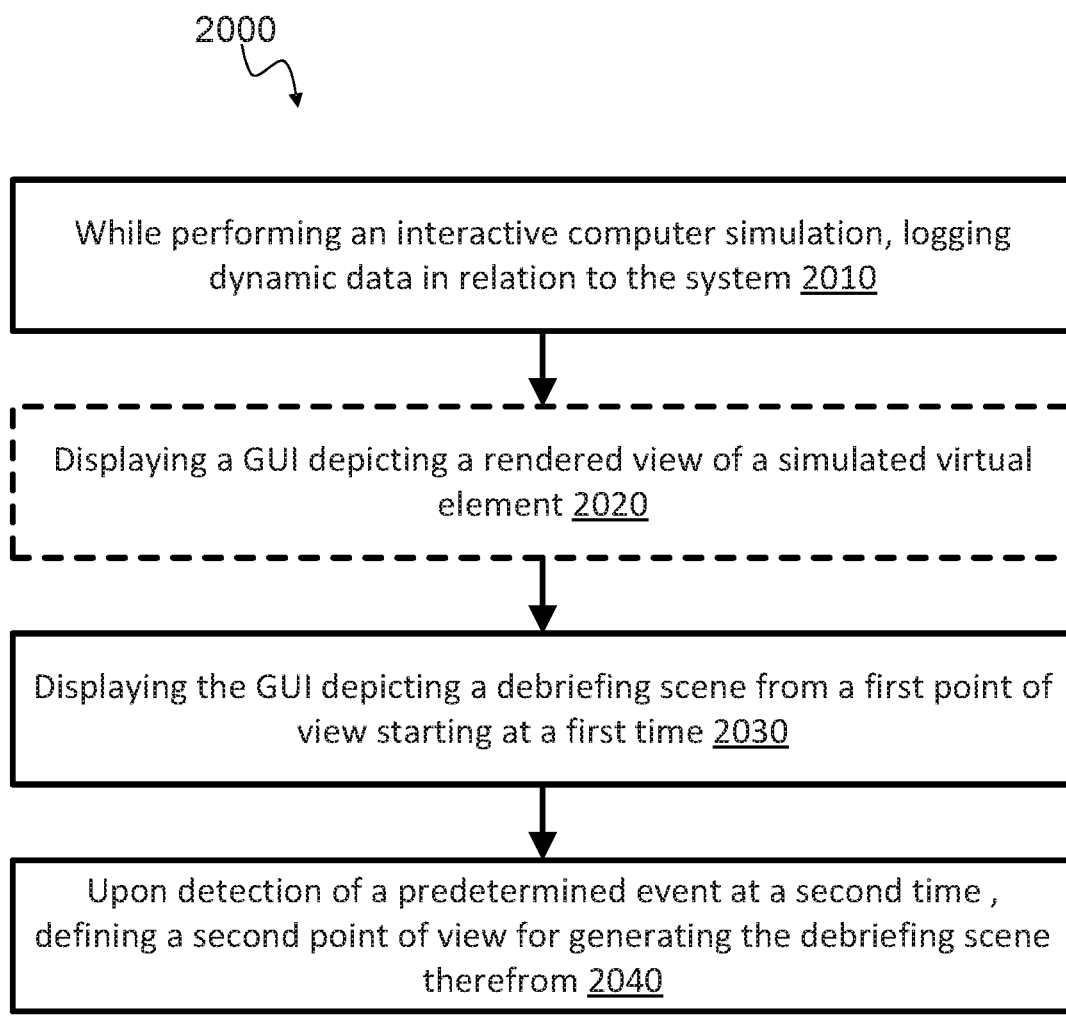
FIG. 2 is a flow chart of a first exemplary method in accordance with an embodiment of the present invention.

Reference is now made to a first set of embodiments with more particular reference to FIGS. 1 and 2. It should be noted that the first set of embodiment is not mutually exclusive from a second set of embodiments that will be described with more particular reference to FIGS. 1 and 3. FIG. 2 shows a flow chart of an exemplary method 2000 for debriefing a session from a user in a system. The method comprises, during the session, while the user performs actions on one or more tangible instruments of the system, logging 2010 dynamic data in relation to the system along a session timeline. The dynamic data covering the actions of the user on the one or more tangible instruments of the system. The method 2000 may then continue to be executed during the session or may also be continue to be executed after completion of the session. Likewise, in some embodiments, the dynamic data is previous logged and the method 2000 starts afterwards. The method 2000 comprises displaying 2030 a graphical user interface depicting a debriefing scene, related to the session, from a first point of view starting at a first time within the session timeline. The debriefing scene is generated starting at the first time from at least a first image feed. The first image feed may be loaded from the memory module 1120 or otherwise obtained from a camera of the simulation station 1100 or a perspective selected from a 360 camera thereof (e.g., from the environment tracking module 1180). The first image feed may alternatively or complementarily be rendered from a computer generated environment. For instance, the first image feed may be a rendered virtual view from the outside of the system (e.g., virtual camera position towards the system from the outside for which images are rendered to simulate an actual camera from that position). An instructor present during debriefing of the session is then able, to the extent that it is necessary, to discuss what is being shown in the debriefing scene.

In the context of a training session performed in the simulation station 1100 configured as an interactive computer flight simulator in which the virtual simulated element is a simulated aircraft, the first feed of image may first be automatically selected from a camera (or a perspective selection from a 360-degree camera) from the environment tracking module 1180 having a wide view angle towards the instrument module 1160 (i.e., towards replicated cockpit). The first image feed may therefore show the trainee(s) getting in position in the flight simulator and performing pre-flight verifications. It may be possible to dynamically zoom in the first image feed towards a region thereof (e.g., center of the feed or towards a specific point) without changing the point of view.

Upon detection of a predetermined event in the dynamic data at a second time along the session timeline, the method 2000 continues with defining 2040 a second point of view different from the first point of view. From the second time along the session timeline, the debriefing scene is generated from at least a second image feed (recording and/or rendered images). The second feed of images has characteristics similar to the ones presented for the first image feed. Getting back to the example in the context of the training session performed in the interactive computer flight simulator, the predetermined event may correspond an event triggered by the trainee(s) (e.g., the decision to turn on an engine (which represent one example of dynamic simulated sub-system) of the simulated aircraft at the second time along the session timeline). The predetermined event may also correspond to an event involving the simulated aircraft but not directly triggered by the trainee(s) (e.g., communication received from a simulated control tower). The predetermined event may also correspond to an event involving the simulated aircraft ultimately linked to a decision of the trainee(s), but not necessarily directly (e.g., lift of the wheel(s) from the runway or the aircraft reaching a defined altitude).

From that time, the second point of view is selected, which involves the second image feed. For instance, for the predetermined event involving the wheels lifting from the runway, the second feed of images may be set to a rendered view of from the outside of the simulated aircraft allowing easy discrimination of the simulated aircraft pitch. For instance, for the predetermined event involving the communication received from the simulated control tower, the second feed of images may be set to a first camera angle showing the face of the trainee on one half of the debriefing scene and, at the same time, a second camera angle showing the transponder on the instrument module 1160 (e.g., expecting the trainee to set the transponder in response to the communication). Sound recording may also be played back at that time. As previously mentioned, different portions of a single image feed from a 360 camera may represent and be treated as distinct image feeds in the method 2000. The instructor present during debriefing of the session is then able, to the extent that it is necessary, to discuss what is being shown in the debriefing scene without having to necessarily pause or manually select the second point of view.

In most embodiments, generating the first image feed and the second image feed will be performed from rendered images of the computer generated environment as well as from one or more image feed recordings made during the session, but it is possible for the method 2000 to involve only one of those two types of image feeds.

The predetermined event may also be triggered (or received) from a monitoring or debriefing station 1700 or 1600 and a selection of the second point of view may also be received from the monitoring or debriefing station 1700 or 1600. For instance, an instructor at the monitoring station 1700 during the session may have manually set the second point of view and taken note at that point in time of a particular event. During debriefing of the session at the debriefing station, the particular event becomes a predetermined event and the second point of view is automatically selected.

In some embodiments, the system subject of the debriefing is an actual aircraft and not a simulated aircraft. The tangible instruments may therefore comprise elements of an aircraft cockpit. The debriefing session would typically take place on the ground after completion of a flight at a debriefing station 1600, a debriefing station 1600 may also be provided, in addition or alternatively, directly on the plane (e.g., different pilots may each train in sessions for a certain time and debrief the session on the plane while another pilot continues training).

In some embodiments, prior to displaying 2030 and after completion of the session, the method 2000 may comprise loading the dynamic data at a debriefing station. In some cases, detection of the predetermined event in the dynamic data may be performed after completion of the session, in real-time priority processing, at the debriefing station. In other cases, and/or as computing resources allow, each of a plurality of predetermined events may be associated in the dynamic data, in non-real-time priority processing and after completion of the session and, with one or more of the image feeds along the session timeline. As such, the session timeline is completed or partially pre-processed so that events and point of view selections are identified prior to the display at the debriefing station.

Defining the second point of view 2040 may performed by matching the predetermined event with one of a plurality of preset configurations (e.g., lift off brings a default outside view of the plane).

In some embodiments, after defining the second point of view, a transition debriefing scene may be generated from the first point of view towards the second point of view (e.g., for providing a smooth transition between the two points of view). The transition debriefing scene may comprise rendered images from a virtual representation of the system. The transition debriefing scene may have a duration (dynamically set based on a real or virtual distance between the points of view or fixed for every transition). The session timeline of the debriefing may be paused or may also be allowed to continue during duration of the transition debriefing scene. Various visual and/or sound effect(s) may be added to the transition debriefing scene.

The method 2000 may also involve loading a session plan for the session and the predetermined event may be detected from the session plan.

When more than one sessions are held in the system, the method may further comprise logging a second set of dynamic data in relation to the system along a second session timeline. The second set of dynamic data covers a second set of actions on the one or more tangible instruments. A second plurality of image feeds related to the second along the second session timeline may be recorded. The method 2000 may then also comprise identifying trends between the actions performed during the session and the second set of actions performed during the second session by detecting one or more matching events in the dynamic data and the second set of dynamic data, the predetermined event corresponding to one of the matching events.

Figure 3:
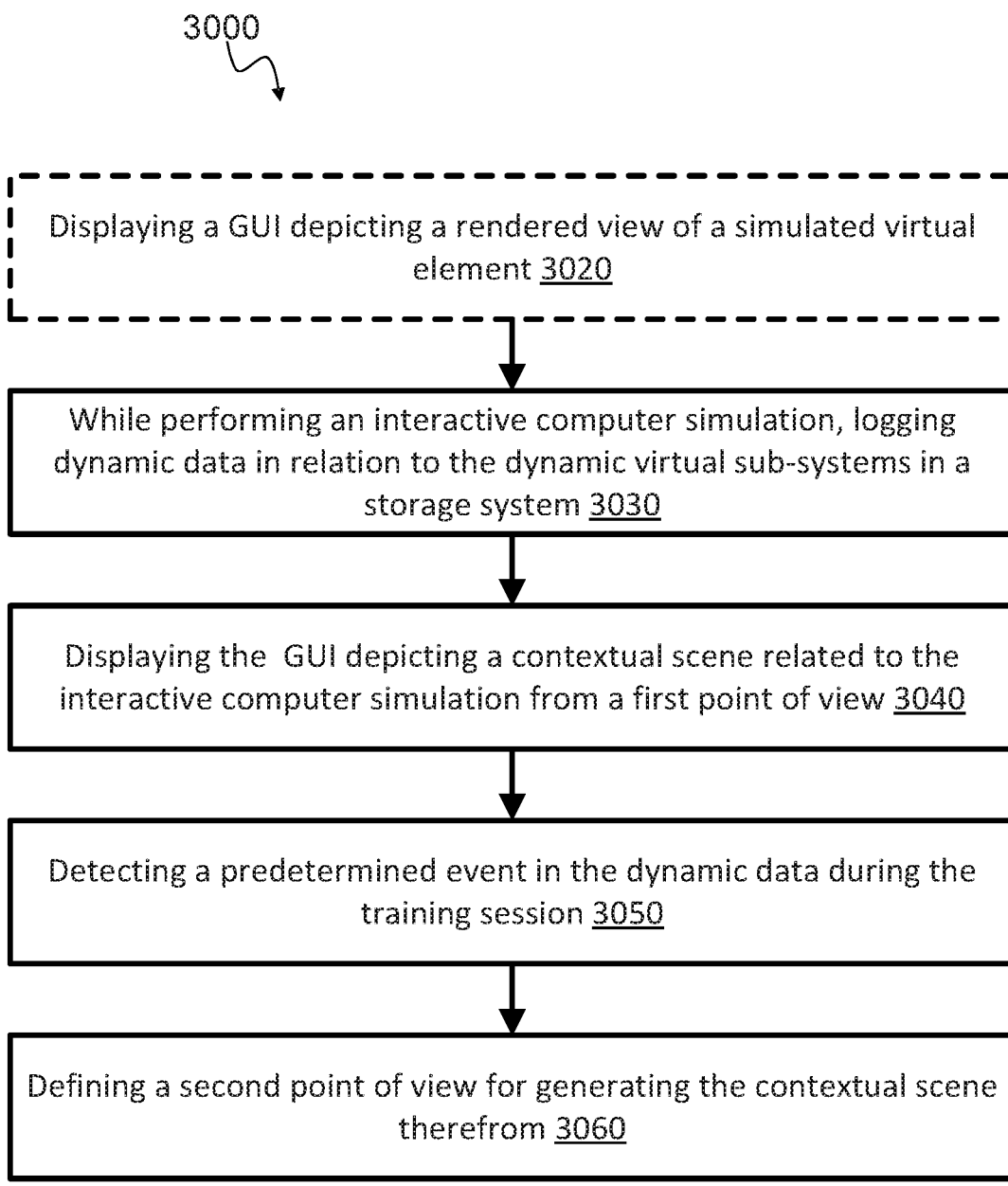
FIG. 3 is a flow chart of a second exemplary method in accordance with an embodiment of the present invention.

Reference is now made to the second set of embodiments with more particular reference to FIGS. 1 and 3. As previously noted, the second set of embodiment is not mutually exclusive from the first set of embodiments described with more particular reference to FIGS. 1 and 2. FIG. 3 shows a flow chart of a method 3000 for monitoring a training session from a trainee in an interactive computer simulation system. The method 3000 comprises, during the training session, while the trainee performs actions in an interactive computer simulation station on one or more tangible instruments thereof for controlling a virtual simulated element, logging 3030 dynamic data related to the actions of the trainee. At a monitoring station 1700 of the interactive computer simulation system and during the training session, the method 3000 continues with displaying 3040 a graphical user interface 1750 depicting a contextual scene related to the interactive computer simulation from a first point of view. A predetermined event is then detected 3050 in the dynamic data during the training session. The method 3000 continues by, at the monitoring station 1700, defining 3060 a second point of view different from the first point of view. The contextual scene is generated in the graphical user interface 1750 after the predetermined event detection from the second point of view.

Skilled persons will readily recognize that the teachings related to point of view selection described in relation the first set of embodiments are applicable, mutatis mutandis, to the second set of embodiments. Likewise, certain aspects presented hereinbelow with particular focus on the second set of embodiments may also be applicable, mutatis mutandis, to the first set of embodiments.

The main aspects are briefly repeated herein, but the reader is invited to consider the applicable teachings previously presented hereinabove. The method 3000 may comprise receiving the predetermined event from the monitoring station 1700 and receiving a selection of the second point of view from the monitoring station 1700. The interactive computer simulation station 1100 may be a flight simulator training station related to a simulated aircraft and the one or more tangible instruments 1160 may comprise elements of a replicated aircraft cockpit and the virtual simulated element may be a simulated aircraft.

The method 3000 may further comprise generating the contextual scene from one or more image feeds recorded in the interactive computer simulation station during the training session and from one or more image feeds rendered from the computer generated environment.

The method 3000 may also further comprise, in non-real-time priority processing and after completion of the session, associating each of a plurality of predetermined events in the dynamic data with one or more of the image feeds along the session timeline, the plurality of predetermined events comprising the predetermined event for subsequent debriefing of the session.

In some embodiments, defining 3060 the second point of view may be performed by matching the predetermined event with one of a plurality of preset configurations for the graphical user interface 1750.

Defining the second point of view 3060 may also, alternatively or additionally, comprise selecting the second point of view upon identification of the predetermined event as being associated therewith. The method 3000 may then further comprise setting the association between the second point of view and the predetermined event by statistically computing a plurality of past point of view selection decisions made from the monitoring station for at least one of the predetermined event and the training session. The past data may relate to all sessions from past year, and/or to decision made by a specific instructor for selecting point of view during a specific session (e.g., more weight given to last decisions). The past data may also be analyzed for a sub group of users. The statistical computing of past selection decisions may be performed considering identity of at least one of a decision maker at the monitoring station and identify of the trainee. It is to be noted that the statistical analysis may also be performed regarding predetermined events in relation the first set of embodiments.

Detection of the predetermined event in the dynamic data may be performed in real-time priority processing at the monitoring station 1700.

The method 3000 may involve, after defining the second point of view generating a transition contextual scene is generated from the first point of view towards the second point of view.

The method 3000 may further comprise loading a session plan for the training session, and the predetermined event may detected from the session plan.

1 The method of claim 1, wherein the predetermined event is a malfunction event in relation to the virtual simulated element and the second point of view is selected considering focus thereof on at least one of the tangible instruments that the trainee is expected to engage considering the malfunction event.

2 The method of claim 1, wherein the predetermined event is a collision-related event in relation to the virtual simulated element and the second point of view is selected considering focus thereof on a visible element in the interactive computer simulation station that the trainee is expected to locate considering the collision-related event.

The tangible instrument provided by the instrument modules 1160, 1260 and/or 1360 are tightly related to the element being simulated. In the example of the simulated aircraft system, typical instruments include various switches, levers, pedals and the like accessible to the user for controlling the aircraft in the interactive computer simulation. Depending on the type of simulation (e.g., level of immersivity), the tangible instruments may be more or less realistic compared to those that would be available in an actual aircraft. For instance, the tangible instrument provided by the modules 1160, 1260 and/or 1360 may replicate an actual aircraft cockpit where actual instruments found in the actual aircraft or physical interfaces having similar physical characteristics are provided to the user (or trainee). As previously describer, the actions that the user or trainee takes with one or more of the tangible instruments provided via the instrument module(s) 1160, 1260 and/or 1360 (modifying lever positions, activating/deactivating switches, etc.) allow the user or trainee to control the virtual simulated element in the interactive computer simulation. In the context of an immersive simulation being performed in the interactive computer simulation system 1000, the instrument module 1160, 1260 and/or 1360 would typically support a replicate of an actual instrument panel found in the actual system being the subject of the immersive simulation. In such an immersive simulation, the dedicated graphics processing unit 1132 would also typically be required. While the present invention is applicable to immersive simulations (e.g., flight simulators certified for commercial pilot training and/or military pilot training), skilled persons will readily recognize and be able to apply its teachings to other types of interactive computer simulations.

In some embodiment, an optional external input/output (I/O) module 1162 and/or an optional internal input/output (I/O) module 1164 may be provided with the instrument module 1160. Skilled people will understand that any of the instrument modules 1160, 1260 and/or 1360 may be provided with one or both of the I/O modules such as the ones depicted for the computer system 1000. The external input/output (I/O) module 1162 of the instrument module 1160, 1260 and/or 1360 may connect one or more external tangible instruments (not shown) therethrough. The external I/O module 1162 may be required, for instance, for interfacing the interactive computer simulation system 1000 with one or more tangible instrument identical to an Original Equipment Manufacturer (OEM) part that cannot be integrated into the computer system 1100 and/or the simulation station(s) 1200, 1300 (e.g., a tangible instrument exactly as the one that would be found in the actual system subject of the interactive simulation). The internal input/output (I/O) module 1162 of the instrument module 1160, 1260 and/or 1360 may connect one or more tangible instruments integrated with the instrument module 1160, 1260 and/or 1360. The I/O 1162 may comprise necessary interface(s) to exchange data, set data or get data from such integrated tangible instruments. The internal I/O module 1162 may be required, for instance, for interfacing the interactive computer simulation system 1100 with one or more integrated tangible instrument identical to an Original Equipment Manufacturer (OEM) part (e.g., a tangible instrument exactly as the one that would be found in the actual system subject of the interactive simulation). The I/O 1162 may comprise necessary interface(s) to exchange data, set data or get data from such integrated tangible instruments.

The graphical user interface module 1150 may also display (2020, 3020) a rendered view of the virtual simulated element.

In some embodiments, a simulation plan may further be loaded (not shown) from the storage system 1500 in relation the interaction computer simulation that involves the virtual simulated element. The simulation plan may comprise a training plan, a lesson plan or a scenario-based plan (e.g., with specific or dynamic objectives to be reached). The simulation plan may also be used alternatively or additionally to set the period of time covering simulated events from the interactive computer simulation related to the selected virtual sub-system.

A malfunction event may be triggered by the processing module 1130 during the interactive computer simulation (e.g., in real-time processing or real-time processing priority). The malfunction event may be triggered from the simulation plan and/or the graphical user interface module 1150 may further receive a malfunction selection that triggers the malfunction event. For instance, an instructor may decide, though graphical user interface module 1150, to initiate a malfunction event during the interactive computer simulation performed in the interactive computer simulation system 1000. The trigger of the malfunction event may be done for the purpose of measuring the reaction of one or more trainees (e.g., present in the simulation station 1100). In some embodiments, two trainees and an instructor are present in the simulation station 1100 while the interactive computer system is performed in the interactive computer simulation system 1000. The initiated malfunction event from the instructor may be required to evaluate the competences of one or both of the trainees therein when faced with specific circumstances. The instructor may also evaluate the competences of one or both of the trainees in the computer system 1100 when faced with specific circumstances triggered by the scenario-based plan at a specific moment (e.g., not related to actions of the trainee(s) in the interactive computer simulation) or as a feedback of actions from the trainees in the interactive computer simulation), which may or may not be related to a malfunction event. Likewise, the instructor may also evaluate the competences of one or both of the trainees in the computer system 1100 when faced with specific circumstances that are not related to a malfunction (e.g., regular procedure or expected events). The simulation station 1100 and the method 2000 and/or 3000 may then be specifically used for identifying and debriefing one or more of the reactions of the trainees of the computer system 1100.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for generating a context-sensitive debriefing scene from two distinct image feeds of a training session completed on an interactive simulation system having a tangible instrument, the method comprising:
   during the session, logging dynamic data generated by actions performed by a trainee on the tangible instrument to control a virtual simulated element in a computer-generated environment of the interactive simulation system, wherein the interactive simulation system is an interactive computer simulation station and wherein the interactive computer simulation station is a flight simulator training station related to a simulated aircraft and the tangible instrument comprises elements of a replicated aircraft cockpit and the virtual simulated element is a simulated aircraft;
   processing the dynamic data to detect the occurrence of a predetermined event separating a first and second period of the session;
   selecting a perspective as a function of the event;
   processing the image feeds as a function of the selected perspective to generate the debriefing scene, wherein the debriefing scene presents:
      a view of at least one of the trainee and the interactive simulation system during the first period from a perspective different from the selected perspective; and
      a view of at least one of the trainee and the interactive simulation system during the second period from the selected perspective; and
   providing the generated debriefing scene for display within a graphical user interface.

2. The method of claim 1, further comprising generating two distinct image feeds from at least one of rendered images of the computer-generated environment of the interactive simulation system and one or more image feed recordings made during the session.

3. The method of claim 1, further comprising recording at least one image feed from multiple perspectives during the session along the session timeline, the selected perspective is one of the multiple perspectives.

4. The method of claim 1, further comprising receiving the predetermined event.

5. The method of claim 1, further comprising, prior to displaying and after completion of the session, loading the dynamic data at a debriefing station.

6. The method of claim 5, wherein detection of the predetermined event in the dynamic data is performed after completion of the session in real-time priority processing at the debriefing station.

7. The method of claim 1, further comprising, prior to displaying, in non-real-time priority processing and after completion of the session and, associating each of a plurality of predetermined events in the dynamic data with multiple image feeds along the session timeline, the plurality of predetermined events comprising the predetermined event.

8. The method of claim 1, further comprising generating a transition debriefing scene between the first period and the second period.

9. The method of claim 8, wherein the transition debriefing scene comprises rendered images from a virtual representation of the system.

10. A debriefing system for generating a context-sensitive debriefing scene from two distinct image feeds of a training session completed on an interactive simulation system having a tangible instrument, the debriefing system comprising:
   one or more tracking devices configured to, during the session:
      log dynamic data generated by actions performed by a trainee on the tangible instrument to control a virtual simulated element in a computer-generated environment of the interactive simulation system, wherein the interactive simulation system is a flight simulator training station, wherein the tangible instrument comprises elements of a replicated aircraft cockpit and wherein the virtual simulated element is a simulated aircraft; and
      record a plurality of image feeds from multiple perspectives related to the session along a session timeline; and a processing unit configured to:
> process the dynamic data to detect the occurrence of a predetermined event separating a first and second period of the session;
> select a perspective from the multiple perspectives as a function of the event;
> process the image feeds as a function of the selected perspective to generate the debriefing scene, wherein the debriefing scene presents:
> > a view of at least one of the trainee and the interactive simulation system during the first period from a perspective different from the selected perspective; and
> > a view of at least one of the trainee and the interactive simulation system during the second period from the selected perspective; and
> provide the generated debriefing scene for display within a graphical user interface.

11. A non-transitory memory having computer-readable instructions stored thereon for generating a context-sensitive debriefing scene from two distinct image feeds of a training session completed on an interactive simulation system having a tangible instrument, which when executed by a processing unit of the interactive simulation system configure the processing unit to:
> during the session, log dynamic data generated by actions performed by a trainee on the tangible instrument to control a virtual simulated element in a computer-generated environment of the interactive simulation system, wherein the interactive simulation system is a flight simulator training station, wherein the tangible instrument comprises elements of a replicated aircraft cockpit and wherein the virtual simulated element is a simulated aircraft;
> process the dynamic data to detect the occurrence of a predetermined event separating a first and second period of the session;
> select a perspective as a function of the event;
> process the image feeds as a function of the selected perspective to generate the debriefing scene, wherein the debriefing scene presents:
> > a view of at least one of the trainee and the interactive simulation system during the first period from a perspective different from the selected perspective; and
> > a view of at least one of the trainee and the interactive simulation system during the second period from the selected perspective; and
> provide the generated debriefing scene for display within a graphical user interface.

* * * * *